(12) United States Patent
Gao et al.

(10) Patent No.: US 9,113,367 B2
(45) Date of Patent: Aug. 18, 2015

(54) METHOD, APPARATUS AND SYSTEM FOR DETERMINING VOLTAGE STANDING WAVE RATIO IN A DOWNLINK PERIOD OF RADIO COMMUNICATION

(75) Inventors: Kelvin Gao, Beijing (CN); Yazhuo Li, Beijing (CN)

(73) Assignee: OPTIS CELLULAR TECHNOLOGY, LLC, Plano, TX (US)

( * ) Notice: Subject to any disclaimer, the term of this patent is extended or adjusted under 35 U.S.C. 154(b) by 102 days.

(21) Appl. No.: 14/113,959

(22) PCT Filed: Apr. 29, 2011

(86) PCT No.: PCT/CN2011/000759
§ 371 (c)(1),
(2), (4) Date: Oct. 25, 2013

(87) PCT Pub. No.: WO2012/145866
PCT Pub. Date: Nov. 1, 2012

(65) Prior Publication Data
US 2014/0050114 A1     Feb. 20, 2014

(51) Int. Cl.
*G01R 31/08* (2006.01)
*H04W 24/08* (2009.01)
*G01R 27/06* (2006.01)
*H04B 17/10* (2015.01)

(52) U.S. Cl.
CPC .............. *H04W 24/08* (2013.01); *G01R 27/06* (2013.01); *H04B 17/103* (2015.01)

(58) Field of Classification Search
USPC ........................................... 455/115.1, 67.11
See application file for complete search history.

(56) References Cited

U.S. PATENT DOCUMENTS 5,471,146 A * 11/1995 Krayeski et al. .............. 324/637
6,151,482 A * 11/2000 Eriksson ..................... 455/67.11
(Continued)

FOREIGN PATENT DOCUMENTS

| CN | 1959421 A | 5/2007 |
|---|---|---|
| CN | 1983882 A | 6/2007 |
| EP | 2249494 A1 | 11/2010 |

OTHER PUBLICATIONS

International Search Report for PCT/CN2011/000759, mailed Feb. 9, 2012, 4 pages.
(Continued)

*Primary Examiner* — Duc C Ho
(74) *Attorney, Agent, or Firm* — Vincent J. Allen; Austin C. Teng; Carstens & Cahoon, LLP

(57) ABSTRACT

The present invention discloses a method for determining a Voltage Standing Wave Ratio (VSWR) in downlink period of a radio communication, comprising: coupling a forward signal into a Transmitter Observation Receiver (TOR) via a Radio Frequency (RF) switch; feeding a reversed signal in a reversed path from a third port of a circulator into the TOR via the RF switch; making down conversion, filtering and converting the forward signal and the reversed signal from an analog signal into digital baseband signal respectively; measuring and storing power levels of the forward signal and the reversed signal in form of digital baseband; and calculating VSWR or Return Loss (RL) value from the stored power levels of the forward signal and the reversed signal. A corresponding apparatus and radio communication system are also provided. This provides an improved VSWR detection method with low complexity and low cost, etc.

25 Claims, 7 Drawing Sheets

(56) References Cited

U.S. PATENT DOCUMENTS

| | | | |
|---|---|---|---|
| 8,045,643 B1* | 10/2011 | Bal et al. | 375/297 |
| 8,155,037 B2* | 4/2012 | Kasai et al. | 370/310 |
| 2006/0035600 A1* | 2/2006 | Lee et al. | 455/78 |
| 2007/0010216 A1 | 1/2007 | Neustadt et al. | |
| 2010/0222012 A1* | 9/2010 | Shibuya et al. | 455/79 |
| 2011/0279192 A1* | 11/2011 | Nash et al. | 333/105 |

OTHER PUBLICATIONS

Extended European Search Report for PCT/CN2011/000759, dated Oct. 7, 2014 (7 pages).

International Preliminary Report on Patentability and Written Opinion for PCT/CN20111000759, dated Oct. 29, 2013 (6 pages).

* cited by examiner

METHOD, APPARATUS AND SYSTEM FOR DETERMINING VOLTAGE STANDING WAVE RATIO IN A DOWNLINK PERIOD OF RADIO COMMUNICATION

This application is a 35 U.S.C. §371 national phase filing of International Application No. PCT/CN2011/000759, filed Apr. 29, 2011, the disclosure of which is incorporated herein by reference in its entirety.

TECHNICAL FIELD

The invention generally relates to radio communication, particularly to a method, an apparatus, a system for detecting voltage standing wave ratio (VSWR) in a downlink period of radio communication.

BACKGROUND

In a radio communication system, such as a base station application, in order to avoid damage to functional circuit of e.g. PA, isolator, or circulator, the high power PA output should always have a 50 ohm load connected. Even if a cable is connected, sometimes with a worse return loss, the reflected high power RF signal may damage the RRU. Thus, VSWR monitoring function is typically required in radio communication systems including Base Stations.

VSWR is a measure of how efficiently radio-frequency power is transmitted from a power source (for example, a power amplifier) through a transmission line, into a load (for example, from a power amplifier through a transmission line, to an antenna).

There are many ways of VSWR detection. Typically the detection is made by coupling a forward and reversed signal to independent power detectors, or to receivers and making down conversion to analog baseband. They may follow the principle of signal coupling and use different existing ways to detect the coupled signal.

As an example, in the prior art, VSWR detection may be made on an antenna interface board (AIB) which monitors signals from a Filter Unit (FU) to an antenna, and power detectors are used to detect signal in both FDD and TDD system. FIG. 1 shows an exemplary general interface for VSWR detection in the prior art. FIG. 2 shows an exemplary functional blocks of VSWR in FIG. 1 in the prior art.

As is known, sometimes bad VSWR between the PA board and the FU can also affect the communication quality or even damage the related device (such as a Remote Radio Unit, RRU). However, in the prior art, VSWR between the power amplifier (PA) board and the FU can not be detected. Conventional solutions typically make extra cable direct current (DC) detection between the PA board and the FU, but it can not predict return loss (RL) in high frequency band. In the conventional solutions, VSWR detection has high cost and large size, requiring a Temperature Compensated Crystal Oscillator (TCXO), synthesizer, mixer and detectors for detection of one Antenna port.

Further, the coupler in the antenna interface board will introduce additional insertion loss between the FU and the Antenna; and extra filtering is needed before power detection to prevent the detection from being interfered by unwanted signals coming from outside the Antenna.

SUMMARY

To this end, one object of the invention is thus to address at least one of the above problems by providing an improved VSWR or RL detection method, apparatus or system.

In a first aspect of the invention, a method for determining a Voltage Standing Wave Ratio (VSWR) in downlink period of a radio communication is provided, comprising: coupling a forward signal into a Transmitter Observation Receiver (TOR) via a Radio Frequency (RF) switch; feeding a reversed signal in a reversed path from a third port of a circulator into the TOR via the RF switch; making down conversion, filtering and converting the forward signal and the reversed signal from an analog signal into digital baseband signal respectively; measuring and storing power levels of the forward signal and the reversed signal in form of digital baseband; and calculating VSWR or Return Loss (RL) value from the stored power levels of the forward signal and the reversed signal.

The determining is performed between a Power Amplifier (PA) output and a Filter Unit (FU) in downlink period.

The reversed signal is preferably fed from the third port of the circulator to the RF switch via a high power attenuator in Frequency Division Duplex (FDD) system.

The reversed signal is preferably fed from the third port of the circulator to the RF switch via a Transmit/Receive (T/R) switch and a high power attenuator in Time Division Duplex (TDD) system.

Alternatively, the reversed signal is preferably fed from the third port of the circulator to the RF switch via a coupler connected between a TR switch and a termination in TDD system.

The method may further comprise adjusting a variable attenuator in the reversed path for reversed path gain calibration.

The attenuator is preferably a 20/30 dB attenuator.

The method may further comprise utilizing the TOR and the FU to make interference filtering.

The RF switch has substantially 40 dB isolation.

The reversed signal in a reversed path shares a fraction of a total time in FDD system.

A fraction of a downlink time slot is shared to detect the reversed power in TDD system.

In a second aspect of the invention, an apparatus for detecting a Voltage Standing Wave Ratio (VSWR) in downlink period of a radio communication is provided, comprising: a forward branch, adapted for coupling a forward signal into a Transmitter Observation Receiver (TOR) via the Radio Frequency (RF) switch; a reversed branch, adapted for feeding a reversed signal in a reversed path from a third port of a circulator into the TOR via the RF switch; a TOR receiver, adapted for making down conversion, filtering and converting the forward signal and the reversed signal from an analog signal into digital baseband signal respectively; a processor module, adapted for measuring and storing power levels of the forward signal and the reversed signal in form of digital baseband; and calculating VSWR or Return. Loss (RL) value from the stored power levels of the forward signal and the reversed signal.

The apparatus is arranged for determining the VSWR between a Power Amplifier (PA) output and the FU in downlink period.

A high power attenuator is connected between the third port of the circulator and the RF switch in Frequency Division Duplex (FDD) system.

The third port of the circulator is connected with the RF switch via a Transmit/Receive TR switch and a high power attenuator in Time Division Duplex (TDD) system.

Alternatively, the third port of the circulator is connected to the RF switch via a coupler connected between a TR switch and a termination in TDD system.

The apparatus may further comprise a variable attenuator in the reversed branch for reversed path gain calibration.

The attenuator is preferably a 20/30 dB attenuator.

The TOR and the FU are further used to make interference filtering.

The RF switch has substantially 40 dB isolation.

The reversed signal in a reversed path shares a fraction of a total time in FDD system.

A fraction of a downlink time slot is shared to detect the reversed power in TDD system.

In a third aspect of the invention, a radio communication system comprising an apparatus for determining Voltage Standing Wave Ratio (VSWR) according to the invention is provided.

The radio communication system includes a base station, such as a FDD base station, a TDD base station.

In a fourth aspect of the invention, a computer program product comprising a computer readable medium with computer executable instructions stored thereon, which when executed by a processor causes any of the methods according to the invention is performed.

Advantages with embodiments of the invention comprise:

According to the invention, the real VSWR directly after pin of the isolator/circulator may be monitored, this will handle any returned power after the isolator/circulator.

With the method or the apparatus of the invention, hardware with low cost is applied. For example, reused receiver and new type of isolator with high power attenuator will replace the respective complex and expensive components in the prior art; and only extra small signal level RF switch and a variable ATT are needed.

The method of the invention may further provide a fast response for system monitoring purpose; the return loss/VSWR calculation is made in digital baseband with good accuracy; also, since high performance analog filter and high SFDR ADC of TOR path are used for forward/reversed signals detection, this also provides a good resolution.

No insertion loss is added in a downlink path (FDD&TDD system) and an uplink path (TDD system) since no coupler is needed in the signal transmission path. Simultaneously, almost no power dissipation is caused by the functional circuits since almost only passive circuits are used.

The method and apparatus of the invention may be applied both in TDD system and FDD system.

BRIEF DESCRIPTION OF THE DRAWINGS

The features and advantages of the invention will be more apparent from the following exemplary embodiments of the invention illustrated with reference to the accompanied drawings, in which.

DETAILED DESCRIPTION

Embodiments of the invention will be described more fully hereinafter with reference to the accompanied drawings. It will be apparent to those skilled in the art that the invention may, however, be embodied in many different forms and should not be construed as limited to the embodiments and specific details set forth herein. Like numbers refer to like elements throughout the description.

Figure 1:
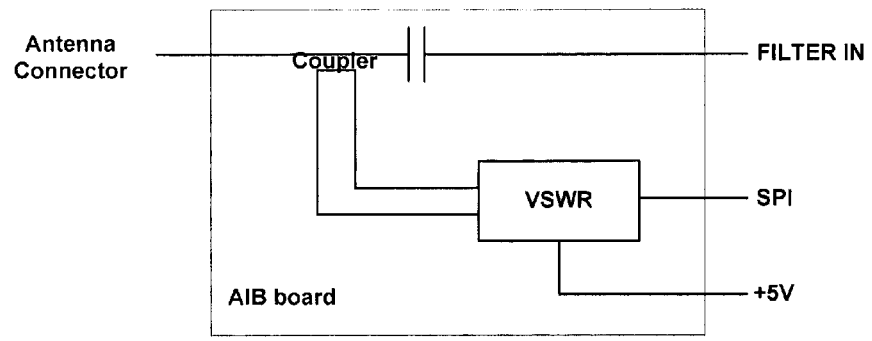
FIG. 1 shows an exemplary general interface for VSWR detection in the prior art.
Figure 2:
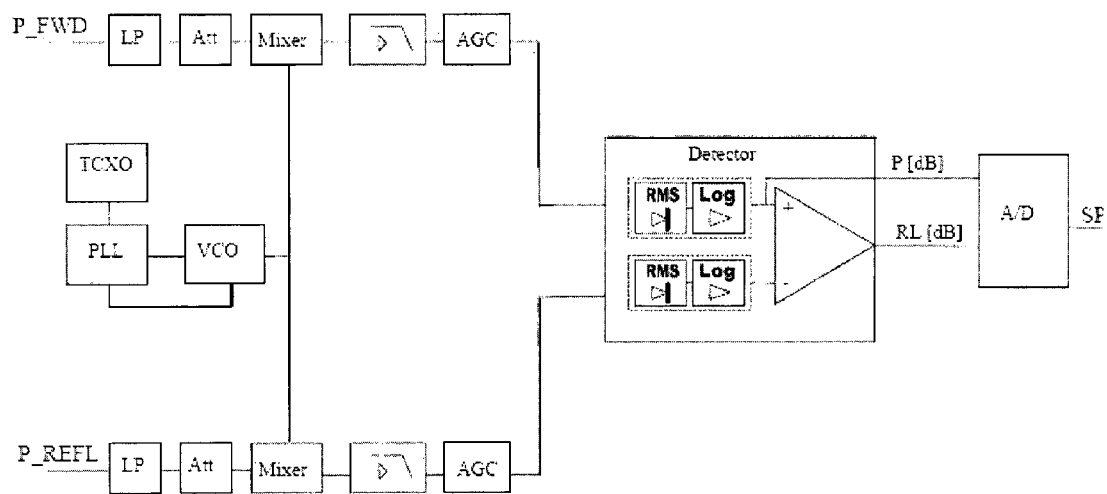
FIG. 2 shows an exemplary functional blocks of VSWR in FIG. 1 in the prior art.
Figure 3:
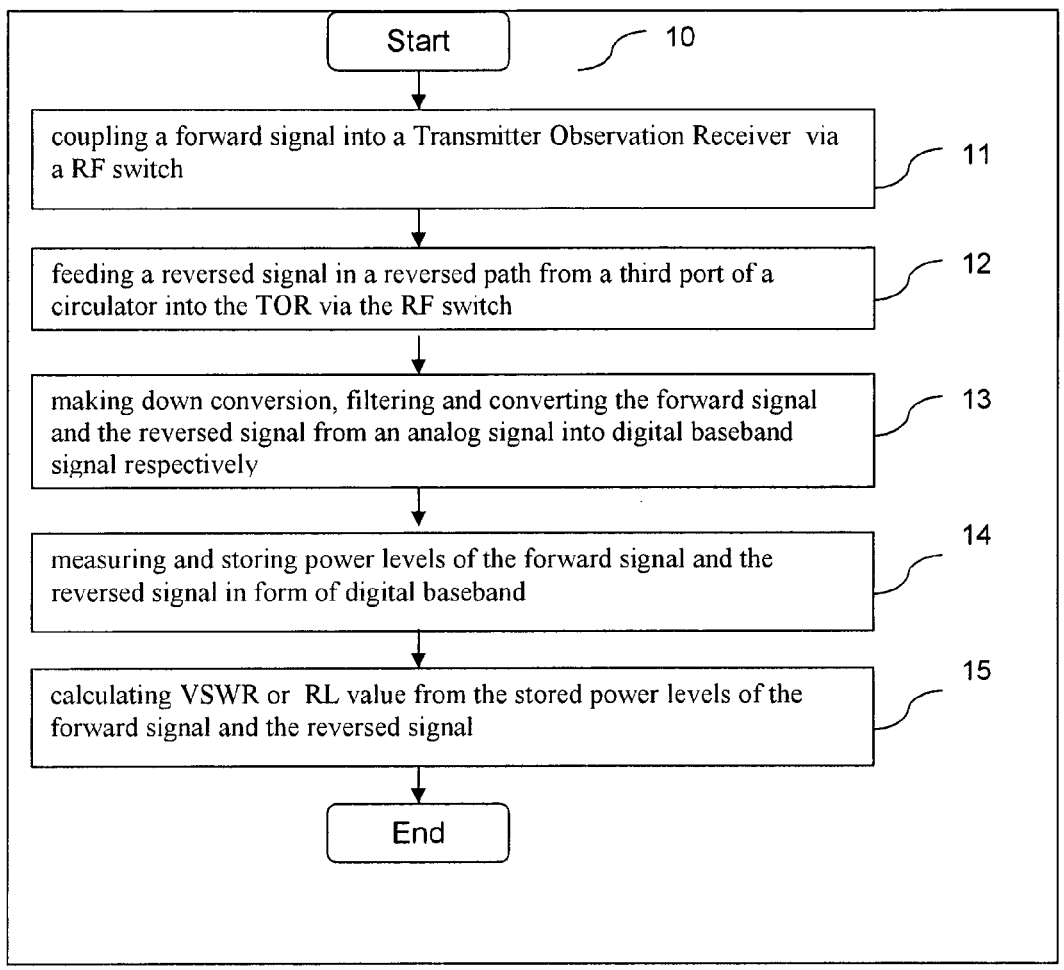
FIG. 3 shows a flowchart of a method for determining VSWR according to an embodiment of the invention.

FIG. 3 shows a flowchart of a method 10 for determining VSWR according to an embodiment of the invention.

The method 10 for determining VSWR according to an embodiment of the invention is achieved by feeding the forward and reversed signals to a same Transmitter Observation Receiver (TOR) receiver via one radio frequency (RF) switch by respectively utilizing a coupler and a 3rd port of a circulator. This is applied for monitoring VSWR of e.g. DPD (Digital Pre-Distortion) PA in a radio communication system including base stations.

Most macro base stations nowadays have Digital Pre-Distortion technology for power amplifiers, and thus a TOR receiver is used accordingly. Both forward signal and reversed signal are monitored by the TOR receiver power meter.

The determination of VSWR in accordance with embodiments of the invention is preferably completed between the PA output and a Filter Unit (FU) in downlink period.

In particular, the method 10 includes the following steps:

In step 11, the forward signal is coupled into a TOR via a RF switch.

The forward signal refers to the signal transmitted from, for example, the power amplifier to the antenna via the filter unit (FU).

As an example, a coupler together with a step attenuator (e.g., 0-15 dB) is used in the forward path to couple and attenuate the forward signal into the TOR receiver via RF switch. The RF switch is preferably a very small signal level. It is to be appreciated by one of ordinary skill in the art, this step may be implemented in other appropriate ways.

In step 12, the reversed signal in a reversed path is fed from a third port of a circulator into the same TOR via the RF switch.

The reversed signal refers to the signal reflected from the output of the circulator, FU, or the antenna due to mismatched impedances in a signal transmission path.

According to an embodiment of the invention, still in the downlink period, the reflected signal goes back to the circulator/isolator in a short time and finally to the same (TOR) receiver. The TOR receiver is re-used to monitor the reversed signal power coming from the reversed path. Also, the TOR receiver may be used to monitor the forward signal power as it is designed for.

The FU may filter out-band interference signals from outside the antenna, this will result in a clean reversed signal.

The reversed path may be implemented in various ways as will be described hereinafter as exemplary embodiments of the invention.

In step 13, using the TOR, the forward signal and the reversed signal are made down conversion, filtered and converted from an analog signal into digital baseband signal respectively.

In particular, the TOR receiver is switched in the forward branch and makes down conversion, filters and converts the analog signal into digital baseband. Further, the TOR receiver is switched in the reversed branch and makes down conversion, filters and converts the analog signal into digital baseband. The conversion and filtering involved in the operation of the TOR may be implemented as in the prior art.

In step 14, power levels of the forward signal and the reversed signal in form of digital baseband are measured and stored.

In step 15, VSWR or Return Loss (RL) value is calculated from the stored power levels of the forward signal and the reversed signal.

In TDD system, it is possible to use (i.e., share) a few part of downlink time slot to monitor the reversed power, without degradation the DPD performance. In FDD system, the reversed signal in a reversed path could also share a very few part of the total time with the same concept.

With calculation (in FPGA) of the detected forward power and reversed power, it is know exactly the return loss after isolator (circulator) output port, i.e. between PA board and FU in a short time.

The RL may be calculated by the equations below:

$$RL\ (dB) = -(\text{reversed power (dBm)} - \text{forward power (dBm)})$$

A VSWR value is calculated through a conversion accordingly as below.

$$VSWR = \frac{10^{\frac{RL}{20}} + 1}{10^{\frac{RL}{20}} - 1}$$

It is to be appreciated by one of ordinary skill in the art that, the order of steps in the methods of embodiments of the invention does not imply any specific order in which the method steps must be worked and in particular the order of individual steps in the methods does not imply that the steps must be performed in this order. Rather, the steps may be performed in any suitable order.

Figure 4:
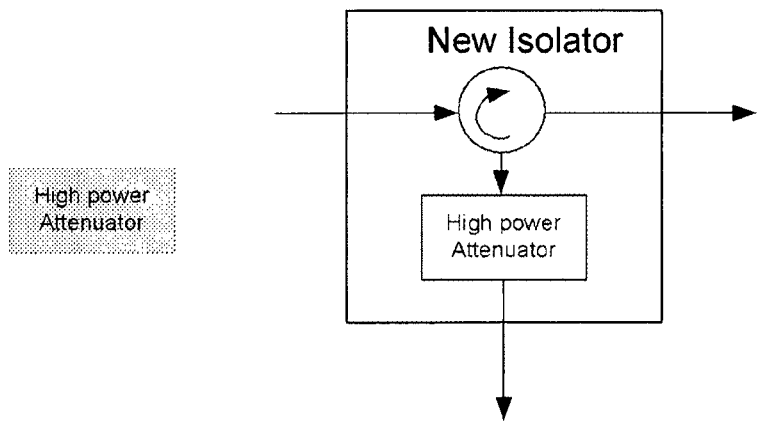
FIG. 4 shows an isolator with a high power attenuator used in the method of FIG. 3 according to an embodiment of the invention.

FIG. 4 shows an isolator with a high power attenuator used in the method of FIG. 3 according to an embodiment of the invention.

A high power attenuator is introduced to replace the termination inside the isolator in FDD system; or replace the termination after the Transmit/Receive (T/R) switch in TDD system.

For example, the attenuator may include the type of high power drop-in/SMD (Surface Mounted Devices) attenuator with a similar size as the termination and acceptable performance.

According to an embodiment of the invention, the attenuator is preferably a 20/30 dB attenuator with ±0.5 dB accuracy.

By using the type of high power attenuator instead of high power termination, the reversed RF signals can be introduced together with TOR input signal into TOR receiver via a RF switch, such as a SPDT (Single Pole Double Throw) RF switch.

In particular, hereinafter three different exemplary embodiments of the method for determining VSWR in downlink period are given with reference to FIGS. 5, 6 and 7.

Figure 5:
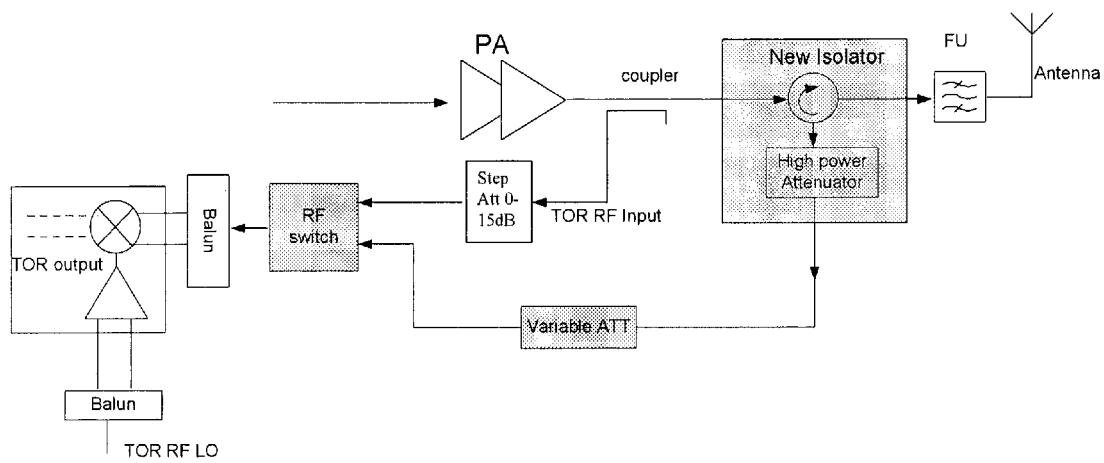
FIG. 5 shows a schematic diagram of an exemplary construction used in the method for determining VSWR in FDD system according to an embodiment of the invention.

As shown in FIG. 5, in FDD system, a high power attenuator is used to replace the termination inside the isolator.

In the embodiment, as described with reference to FIG. 3, the forward signal is coupled into a TOR via a RF switch. A coupler together with a step attenuator (e.g., 0-15 dB) is used in the forward path to couple and attenuate the forward signal into the TOR receiver via RF switch. The RF switch has preferably a very small signal level.

The reversed signal in a reversed path is fed from a third port of a circulator into the same TOR via the RF switch. The reversed signal is fed from an improved isolator to the TOR receiver via the RF switch. The isolator includes a circulator connected with a high power attenuator via its third port.

Preferably, a variable attenuator may be added in the reversed path for reversed path gain calibration. For example, the variable attenuator may be connected between the high power attenuator and the RF switch.

Then, with the TOR receiver, the forward signal and the reversed signal are made down conversion, filtered and converted from an analog signal into digital baseband signal respectively. Power levels of the forward signal and the reversed signal in form of digital baseband are measured and stored in the memory. Thus, the VSWR or Return Loss (RL) value may be calculated from the stored power levels of the forward signal and the reversed signal.

Figure 6:
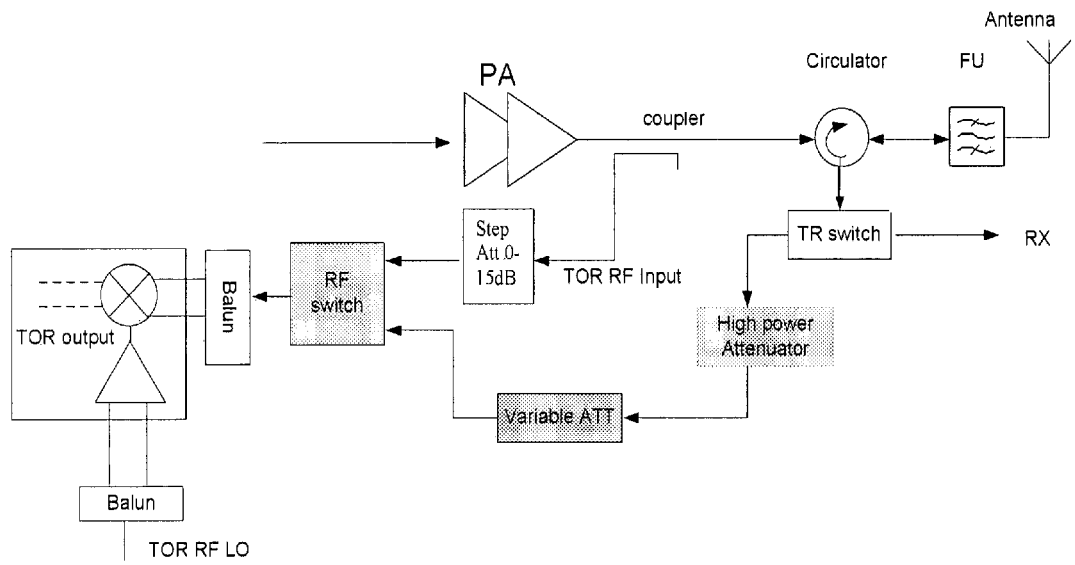
FIG. 6 shows a schematic diagram of an exemplary construction used in the method for determining VSWR in TDD system according to an embodiment of the invention.

FIG. 6 shows an exemplary embodiment of the method for determining VSWR in TDD system.

In the embodiment, a high power attenuator is used to replace the termination after the T/R switch in TDD system. The reversed signal is fed from the third port of the circulator to the RF switch via the Transmit/Receive TR switch and a high power attenuator.

Preferably, a variable attenuator may be added in the reversed path for reversed path gain calibration. For example, the variable attenuator may be connected between the high power attenuator and the RF switch.

Other implementation of the method for determining the VSWR in this embodiment is similar as described in FIG. 5 except the above features, and will thus not be described in detail herein.

Figure 7:
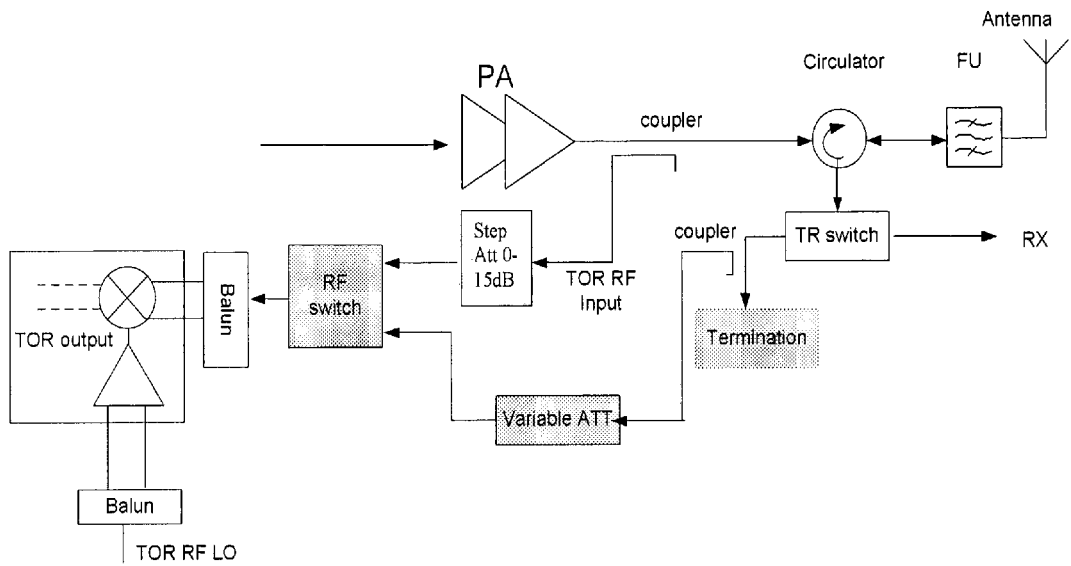
FIG. 7 shows a schematic diagram of another exemplary construction used in the method for determining VSWR in TDD system according to an embodiment of the invention.

FIG. 7 shows another exemplary embodiment of the method for determining VSWR in TDD system.

In the embodiment, the high power attenuator in FIG. 6 is not used. Rather, a coupler is used to couple the reversed signal into the TOR receiver via the RF switch. The coupler may be connected between the TR switch and the termination. The reversed signal is fed from the third port of the circulator to the RF switch via the Transmit/Receive (T/R) switch and the coupler in order.

Preferably, a variable attenuator may be added in the reversed path for reversed path gain calibration. For example, the variable attenuator may be connected between the coupler and the RF switch.

Other implementation of the method for determining the VSWR in this embodiment is similar as described in FIG. 5 except the above features, and will thus not be described in detail herein.

Figure 8:
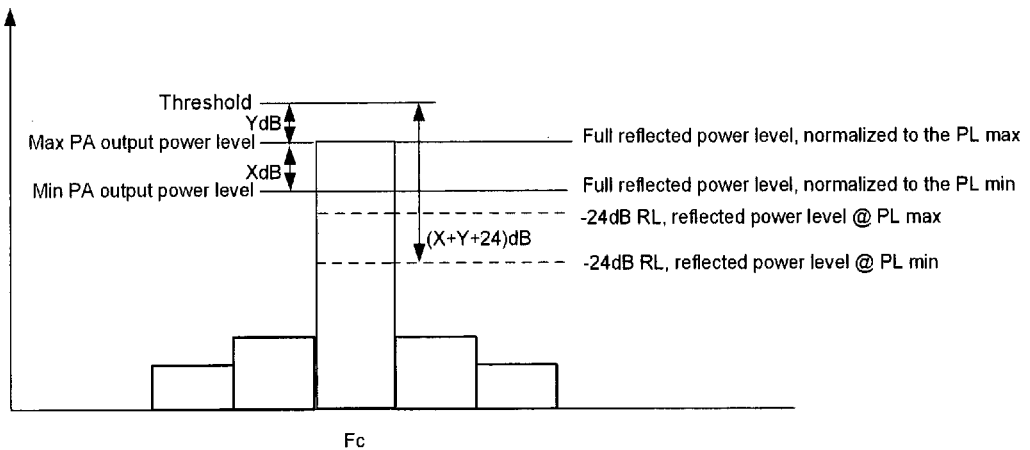
FIG. 8 shows a schematic diagram of dynamic range estimation in TOR receiver in the embodiments of the invention.

FIG. 8 shows a schematic diagram of dynamic range estimation in TOR receiver in the embodiments of the invention.

When system is working in normal downlink period, the power level of the forward signal could be detected by TOR receiver.

The power level of the reversed signal should be calculated and aligned with the requirement of TOR receiver. For example, a target of the variable ATT (small signal level) may be set in the reversed signal path: assuming PA output port has full reflection, the reversed signal power level arrived to the RF switch may be normalized to the same power level as max power level of the forward downlink signal coupled to RF switch.

This will simplify the reversed path gain calibration (in factory) and calculation method of VSWR.

As an example, when the power level of the reversed signal to the RF switch is normalized same as the power level of the max forward signal to the RF switch, with reference to FIG. 8, if the monitored minimum PA power level is 20 dB (X dB) lower than the max PA power level, and ADC threshold margin is 15 dB (Y dB), the requirement for TOR receiver is 24+20+15=59 dBFS, so as to guarantee the monitoring target of 24 dB return loss. This requires no change of the design of the existing TOR receiver, thus simplifying the implementation and reducing the cost.

Further, since TOR receiver has good analog filter, and FU has provided good filtering, there is no need to make extra out-band interference filtering in the methods according to the embodiments of the invention.

Figure 9:
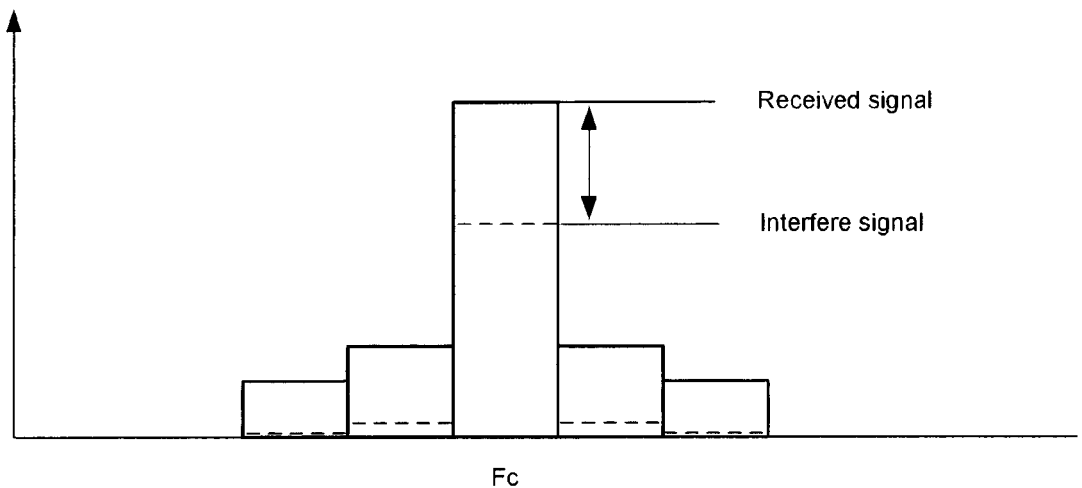
FIG. 9 shows a schematic diagram of leakage between wanted signal and unwanted signal.

FIG. 9 shows a schematic diagram of leakage between wanted signal and unwanted signal in the embodiments of the invention.

Isolation for the RF switch needs to guarantee no visible leakage from the forward or the reversed signal to impact each other in the embodiments of the invention.

Particularly, in the downlink working period, the largest reversed power level leakage is not allowed to impact the forward monitored signal. Preferably, the RF switch with 30 dB isolation will provide a good isolation margin and the interference may be omitted.

In VSWR detection period, the largest forward power level leakage is not allowed to impact the minimum reversed monitored signal. As an example, if a minimum RL is 24 dB and forward signal is 16 dB lower than the reversed signal after RF switch, then the isolation with 16+24=40 dB will be enough.

It is noted, if a wanted signal power level is 0 dBm and an interference power level is 10 dB lower, the added overall signal power level is 0.4 dB higher. 13 dB isolation equals to 0.2 dB higher, 16 dB isolation equals to 0.1 dB higher, and so on.

Therefore, a RF switch with 40 dB isolation is preferable choice in this application, which will guarantee no significant interference to the forward signal and the reversed signal.

Reversed path calibration may be done by injecting a 0 dBm signal from FU output port by controlling the related device (such as RRU) in the corresponding state, and the gain in this reversed path is measured and stored. Gain of forward path is set and stored as well during production. Then the gain difference between the reversed path and the forward path is calculated, and the gain difference may be adjusted to zero by changing the attenuation value of the variable attenuator in the reversed path which is stored as calibration data for reverse signal measurement.

This will compensate component gain variation, and set the largest reversed signal power level fed to RF switch to be normalized to the same power level as max forward downlink signal power level coupled to RF switch. Frequency variation is very small in this application and can be ignored.

It is to be noted that, in practical applications, the insertion loss of the circulator and FU may also be considered in the reversed path calibration.

VSWR detection speed may be fast as required, which may be completed in a fraction of a time slot for example in TDD system. As an example, for TDD LTE, if one downlink time slot (for example, half for forward signal, half for reversed signal) from each 10 frame is used, the measured VSWR result may be updated every 0.1 S. Accordingly, corresponding software is required to update the measured/calculated result quickly in digital baseband.

Hereinafter, estimation for RL/VSWR accuracy may be considered as follows.

Figure 10:
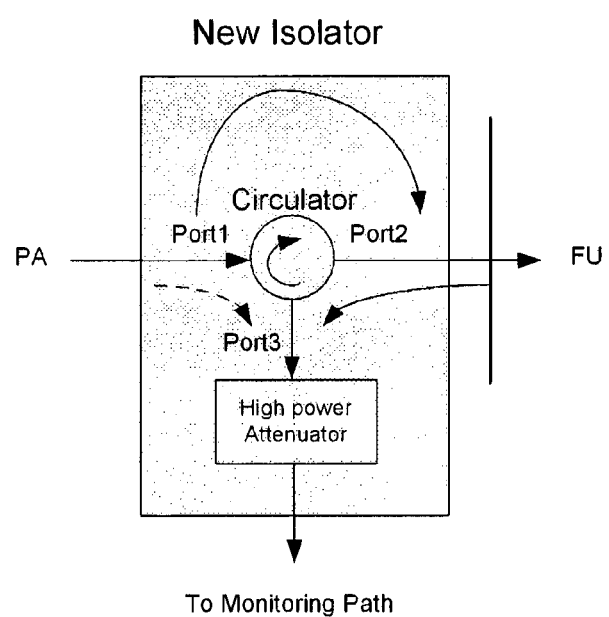
FIG. 10 shows a schematic diagram of signal leakage caused by the circulator itself.

FIG. 10 shows a schematic diagram of signal leakage caused by the circulator itself. In normal case, a circulator itself may have 24 dB isolation (reflection from port2 as shown in FIG. 10 also contributes to the VSWR). In FIG. 10, Port1 is connected to the PA output, Port2 is connected to the FU, and Port3 is connected in the monitored reversed path to the TOR receiver. The isolation here is defined as the leakage in the direction from Port1 to Port3.

TOR receiver dynamic range as described above is good enough for this application.

Current estimation for the RL range/accuracy of this invention is considered to be:

Range: 0~24 dB.

Accuracy: ±4 dB (minimum RL level, 24 dB), ±2 dB (RL level: 15 dB), within ±1 dB (RL level: 0~10 dB).

Figure 11:
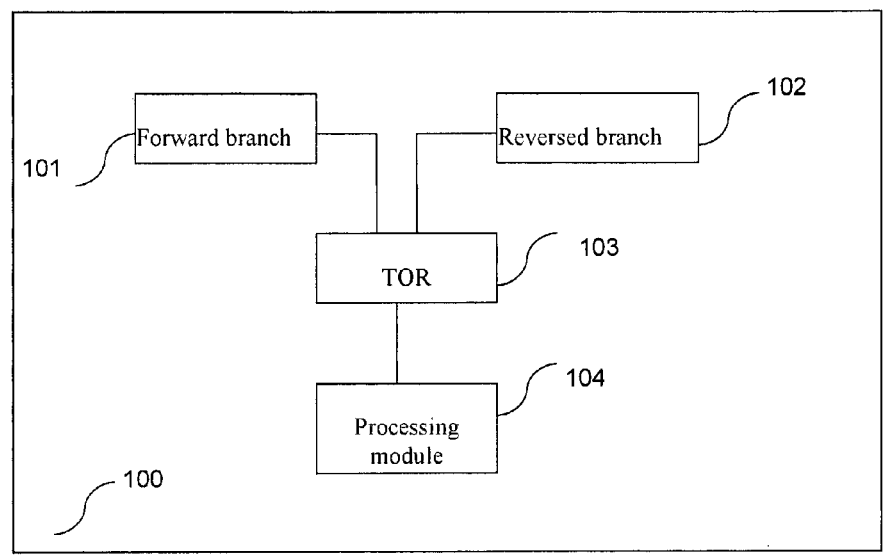
FIG. 11 shows a schematic block diagram of the apparatus for determining VSWR according to an embodiment of the invention.

FIG. 11 shows a schematic block diagram of the apparatus 100 for determining VSWR in downlink period of radio communication according to an embodiment of the invention.

In the embodiment of the invention, the apparatus 100 may include: a forward branch 101 configure for coupling a forward signal into a Transmitter Observation Receiver TOR via the Radio Frequency RF switch; a reversed branch 102 configured for feeding a reversed signal in a reversed path from a third port of a circulator into the same TOR via the RF switch; a TOR receiver 103 configured for making down conversion, filtering and converting the forward signal and the reversed signal from an analog signal into digital baseband signal respectively; a processor module 104 configured for measuring and storing power levels of the forward signal and the reversed signal in form of digital baseband; and calculating VSWR or Return Loss RL value from the stored power levels of the forward signal and the reversed signal.

The apparatus 100 is arranged for determining the VSWR between a Power Amplifier output and the FU in downlink period.

As described above, in one embodiment of the apparatus, in FDD system, a high power attenuator is connected between the third port of the circulator and the RF switch.

In another embodiment of the apparatus, in TDD system, the third port of the circulator is connected with the RF switch via a Transmit/Receive (TR) switch and a high power attenuator.

In yet another embodiment of the apparatus, in TDD system, the third port of the circulator is connected to the RF switch via a coupler connected between a T/R switch and a termination.

Preferably, a variable attenuator may be inserted in the reversed branch for reversed path gain calibration.

It is to be noted that the features set forth in the methods of the embodiments may correspondingly be applied to the apparatuses or systems of the invention. Thus, herein other similar features will not be described again.

Figure 12:
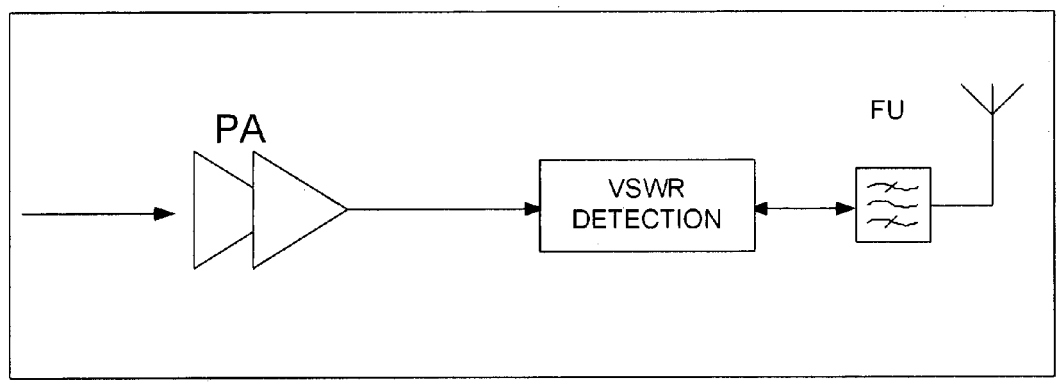
FIG. 12 shows a schematic diagram of a radio communication system including the apparatus of the invention according to an embodiment of the invention.

FIG. 12 shows a schematic diagram of a radio communication system including the apparatus of the invention according to an embodiment of the invention. The radio communication system may refer to a FDD or TDD base station system in radio communication.

Figure 13:
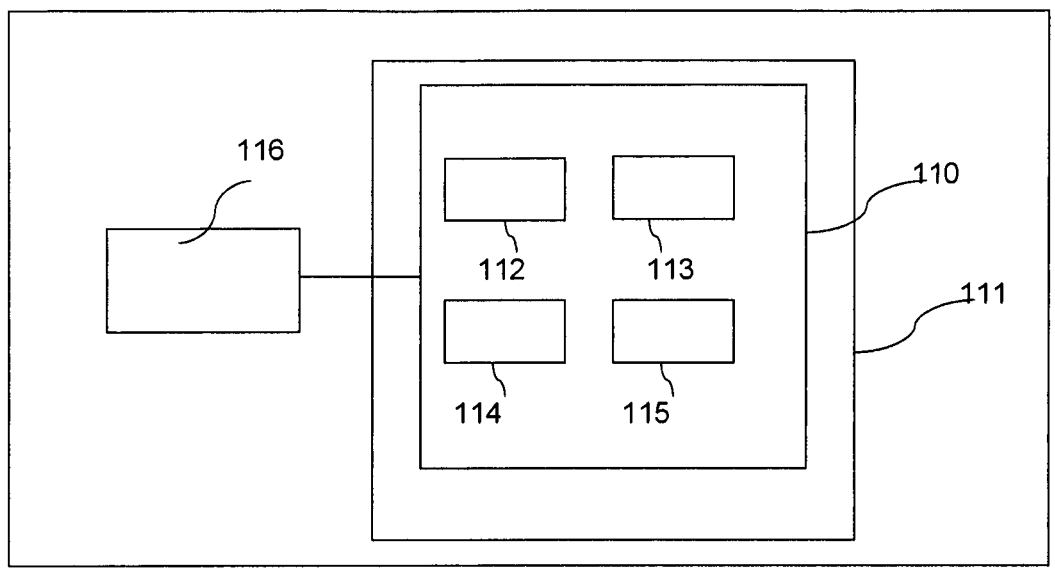
FIG. 13 shows a schematic diagram of a computer program product according to an embodiment of the invention.

FIG. 13 shows a schematic diagram of a computer program product for determining VSWR according to an embodiment of the invention.

As shown in FIG. 13, the computer program product 111 including a computer readable medium 110 includes program modules 112-115 with computer executable code which when run by the processor 116 causes some functions or actions to be implemented. For example, when executed by the processor 116, the program module 112 is adapted to couple a forward signal into TOR via a RF switch. The program module 113 is adapted to feed a reversed signal in a reversed path from a third port of a circulator into the TOR via the RF switch. The program module 114 is adapted to make down conversion, filter and convert the forward signal and the reversed signal from an analog signal into digital baseband signal respectively. The program module 115 is adapted to measure and store power levels of the forward signal and the reversed signal in form of digital baseband; and calculate VSWR or RL value from the stored power levels of the forward signal and the reversed signal.

The processor 116 may, for example, comprise general purpose microprocessor(s), instruction set processor(s) and/or related chips set(s) and/or special purpose microprocessor(s), such as ASICs (application specific integrated circuits). For example, the computer program product 111 may be embodied as a flash memory, a RAM (Random-access memory), ROM (Read-Only memory) or an EEPROM (Electrically Erasable Programmable ROM) or other storage mediums.

Furthermore, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate.

The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and/or functionally distributed between different units and processors.

The terminology used herein is for the purpose of describing particular embodiments only and is not intended to limit to the invention. As used herein, the singular forms "a", "an" and "the" are intended to comprise the plural forms as well, unless otherwise stated. It will be further understood that the terms "comprising", "comprising" and conjugation thereof when used herein, specify the presence of stated features, integers, steps, operations, elements, and/or components, but do not preclude the presence or addition of one or more other features, integers, steps, operations, elements, components, and/or groups thereof.

Although the invention has been particularly shown and described with reference to exemplary embodiments thereof, it will be understood by those skilled in the art that various changes in form and details may be made without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims.

The invention claimed is:

1. A method for determining a Voltage Standing Wave Ratio (VSWR) in a downlink period of a radio communication, comprising:
   coupling a forward signal into a Transmitter Observation Receiver (TOR) via a Radio Frequency (RF) switch;
   feeding a reversed signal in a reversed path from a third port of a circulator into the TOR via the RF switch;
   making down conversion, filtering and converting the forward signal and the reversed signal from an analog signal into digital baseband signal respectively;
   measuring and storing power levels of the forward signal and the reversed signal in form of digital baseband; and
   calculating a VSWR or a Return Loss (RL) value from the stored power levels of the forward signal and the reversed signal.

2. The method of claim 1, wherein the determining is performed between a Power Amplifier output and a Filter Unit (FU) in a downlink period.

3. The method of claim 1, wherein the reversed signal is fed from the third port of the circulator to the RF switch via a high power attenuator in a Frequency Division Duplex (FDD) system.

4. The method of claim 3, wherein the attenuator is a 20/30 dB attenuator.

5. The method of claim 3, wherein the reversed signal in a reversed path shares a fraction of a total time in the FDD system.

6. The method of claim 1, wherein the reversed signal is fed from the third port of the circulator to the RF switch via a Transmit/Receive (TR) switch and a high power attenuator in a Time Division Duplex (TDD) system.

7. The method of claim 6, wherein a fraction of a downlink time slot is shared to detect the reversed power in the TDD system.

8. The method of claim 1, wherein the reversed signal is fed from the third port of the circulator to the RF switch via a coupler connected between a TR switch and a termination in a TDD system.

9. The method of claim 1, further comprising: adjusting a variable attenuator in the reversed path for reversed path gain calibration.

10. The method of claim 1, further comprising: utilizing the TOR and the FU to make interference filtering.

11. The method of claim 1, wherein the RF switch has substantially 40 dB isolation.

12. An apparatus for detecting a Voltage Standing Wave Ratio (VSWR) in a downlink period of a radio communication, comprising:
   a forward branch, adapted for coupling a forward signal into a Transmitter Observation Receiver (TOR) via the Radio Frequency (RF) switch;
   a reversed branch, adapted for feeding a reversed signal in a reversed path from a third port of a circulator into the TOR via the RF switch;
   a TOR receiver, adapted for making down conversion, filtering and converting the forward signal and the reversed signal from an analog signal into digital baseband signal respectively;
   a processor module, adapted for measuring and storing power levels of the forward signal and the reversed signal in form of digital baseband; and calculating a VSWR or a Return Loss (RL) value from the stored power levels of the forward signal and the reversed signal.

13. The apparatus of claim 12, wherein the apparatus is arranged for determining the VSWR between a power amplifier output and the FU in the downlink period.

14. The apparatus of claim 12, wherein, a high power attenuator is connected between the third port of the circulator and the RF switch in a Frequency Division Duplex (FDD) system.

15. The apparatus of claim 14, wherein the attenuator is a 20/30 dB attenuator.

16. The apparatus of claim 14, wherein the reversed signal in the reversed path shares a fraction of a total time in the FDD system.

17. The apparatus of claim 12, wherein the third port of the circulator is connected with the RF switch via a Transmit/Receive (TR) switch and a high power attenuator in a Time Division Duplex (TDD) system.

18. The apparatus of claim 17, wherein a fraction of a downlink time slot is shared to detect the reversed power in the TDD system.

19. The apparatus of claim 12, wherein the third port of the circulator is connected to the RF switch via a coupler connected between a TR switch and a termination in a TDD system.

20. The apparatus of claim 12, further comprising a variable attenuator in the reversed branch for reversed path gain calibration.

21. The apparatus of claim 12, wherein the TOR and the FU are further used to make interference filtering.

22. The apparatus of claim 12, wherein the RF switch has substantially 40 dB isolation.

23. A radio communication system comprising an apparatus for determining Voltage Standing Wave Ratio according to claim 12.

24. The radio communication system of claim 23, wherein the radio communication system includes a base station.

25. A non-transitory computer-readable medium with computer executable instructions stored thereon, which when executed by a processor causes the method of claim 1 to be performed.

* * * * *